United States Patent [19]

Phifer

[11] Patent Number: 4,610,775
[45] Date of Patent: Sep. 9, 1986

[54] METHOD AND APPARATUS FOR CLEARING SHORT-CIRCUITED, HIGH-VOLTAGE CATHODES IN A SPUTTERING CHAMBER

[75] Inventor: Clarence G. Phifer, Columbia, S.C.

[73] Assignee: Westinghouse Electric Corp., Pittsburgh, Pa.

[21] Appl. No.: 759,381

[22] Filed: Jul. 26, 1985

[51] Int. Cl.⁴ ............................................. C23C 15/00
[52] U.S. Cl. .............................. 204/298; 204/192.12; 204/192 SP; 376/419
[58] Field of Search ........................... 204/298, 192 R

[56] References Cited

U.S. PATENT DOCUMENTS

| | | | |
|---|---|---|---|
| 3,427,222 | 10/1967 | Biancheria et al. | 176/68 |
| 3,562,140 | 10/1967 | Skinner et al. | 204/298 |
| 3,632,494 | 11/1967 | Herte et al. | 204/192 R |
| 4,080,281 | 3/1978 | Endo | 204/298 |
| 4,116,793 | 9/1978 | Penfold et al. | 204/298 |
| 4,166,784 | 9/1979 | Chapin | 204/298 |
| 4,283,260 | 8/1981 | Thomas et al. | 204/298 |
| 4,284,489 | 8/1981 | Weber | 204/298 |
| 4,333,814 | 6/1982 | Küyel | 204/298 |
| 4,349,409 | 9/1982 | Shibayama | 204/298 |
| 4,362,611 | 12/1982 | Logan | 204/298 |
| 4,409,087 | 10/1983 | Quick | 204/298 |
| 4,560,462 | 12/1985 | Radford et al. | 204/192 R |

OTHER PUBLICATIONS

Auyang et al., IBM Tech. Disc. Bull., vol. 14, #4, 1971, p. 1032.

Primary Examiner—Arthur P. Demers

[57] ABSTRACT

A method and apparatus for vaporizing any flakes of sputtering target material which short circuit high voltage cathodes during the sputtering of a coating on a substrate such as nuclear fuel pellet positioned in the vacuum chamber of a sputtering device. A separate low voltage, high current auxiliary power source is used to evaporate the shorting flakes. The present method and apparatus reduces the process recovery time in the event of a shorting flake from as long as 6 hours down to as little as 5 minutes without compromising the purity of the sputtered coating. The auxiliary power source may be an ac source which is preferably connected in series with the shorting flake so that current from the ac source will cease as soon as the shorting flake is evaporated. A ballast and/or short circuit indicating device may also be provided in series with the ac source in order to limit the ac current and in order to indicate the presence of shorting flakes. The system may be automated to automatically determine conditions indicative of the existence of a shorting flake and to thereupon automatically initiate a shorting flake evaporation cycle.

30 Claims, 10 Drawing Figures

METHOD AND APPARATUS FOR CLEARING SHORT-CIRCUITED, HIGH-VOLTAGE CATHODES IN A SPUTTERING CHAMBER

BACKGROUND OF THE INVENTION

1. Field of the Invention

The present invention relates to a method and apparatus for clearing electrical shorts and more particularly to a method and apparatus for clearing deposits of conductive or semiconductive flakes from a high-voltage electrode.

2. Background and Description of the Prior Art

Sputtering is a process for depositing a coating onto a substrate. Typically, during a sputtering process, an inert gas is introduced into a vacuum chamber containing an anode, a substrate, and a target cathode. A relatively high dc voltage is applied across the anode and target cathode. The inert gas molecules are ionized to form a plasma. The ionized gas molecules strike the target cathode which causes atoms and/or molecules of the target cathode to be sputtered from the target cathode surface. The substrate is positioned to intercept this sputtered target material which forms an adherent coating upon striking the substrate. Sputtering is a generally line-of-sight coating process.

A sputtering apparatus for making metal films, such as electrical resistors or electrodes of electrical capacitors, is disclosed in U.S. Pat. No. 4,080,281. In the apparatus described in that patent, the substrates are placed in an annular cylindrical cage which serves as the anode. An outer coaxial, annular cylindrical target cathode circumferentially surrounds the cage to sputter radially inward on the cage from all directions. An inner coaxial, rod target cathode lies along the cage's longitudinal axis to sputter radially outwardly from all directions. The cage rotates to cause the metal films to be more uniform.

U.S. Pat. Nos. 3,562,140 and 3,632,494 disclose sputtering apparatus for coating razor blades with chromium.

Sputtering devices may also be used to coat substrates such as nuclear fuel pellets. As is known to those skilled in the art of designing nuclear fuel assemblies, the life of a fuel assembly may be extended by combining an initially larger amount of fissionable material as well as a calculated amount of burnable absorber. Burnable absorbers are materials (such as zirconium diboride, boron, gadolinium, samarium, europium, and the like) which have a high probability (or cross section) for absorbing neutrons, resulting in isotopes of sufficiently low neutron capture cross section so as to be substantially transparent to neutrons, all while producing no new or additional neutrons. The burnable absorber compensates for the larger amount of fissionable material during the early life of the fuel assembly. During reactor operation, the effect of the burnable absorbers becomes progressively reduced resulting in a longer fuel assembly life at a relatively constant fission level. Longer fuel assembly life means less frequent nuclear reactor fuel assembly replacement which is costly and time consuming process.

U.S. Pat. No. 3,427,222 discloses fusion bonding a burnable poison (also known a burnable absorber) layer to the surface of a nuclear fuel pellet substrate.

Commonly assigned U.S. patent application Ser. No. 526,712, now U.S. Pat. No. 4,587,088, ("Coating a Nuclear Fuel with a Burnable Poison" by Kenneth C. Radford, filed Aug. 26, 1983) discloses sputtering as a method for depositing a layer of burnable poison on nuclear fuel pellets.

Commonly assigned U.S. patent application Ser. No. 623,747 now U.S. Pat. No. 4,560,462 ("Apparatus for Coating Nuclear Fuel Pellets with a Burnable Absorber") by Kenneth C. Radford et al., filed June 22, 1984, discloses an apparatus for sputter coating nuclear fuel pellets.

Occasionally, during the sputtering process, a flake of accumulated burnable neutron absorber which was deposited on a surface other than a fuel pellet spalls off and falls onto one of the sputtering cathodes. That flake will constitute a resistive conductor which may short out the high voltage to that cathode and quench the plasma of vaporized neutron absorber in the vacuum chamber.

In a typical sputtering chamber, the dc power source can supply up to about 17 amperes, at approximately 480 volts. A minimum of about 200 volts is required to start and/or maintain a sputtering plasma. Whenever a flake of burnable neutron absorber, such as zirconium diboride, shorts the cathode to ground, the voltage will typically fall to anywhere from zero up to 25 volts D.C., while the current between the cathode and ground will rise to the maximum current of the power supply, typically about 17 amperes. While that small amount of power may make the flake glow, so that its presence can be visually confirmed, only very rarely will it generate sufficient heat to clear the short circuit. In this regard, it is noted that shorting flakes are typically large and thick and therefore difficult to evaporate. Therefore, in a typical prior art sputtering chamber, the presence of a shorting flake between the cathode and ground requires that the chamber be shut down and cleaned out. Since the sputtering chamber operates at a very high vacuum, on the order of 30 microtorr, it normally takes as long as six hours to cool down the sputtering apparatus, open up the vacuum chamber, clean out the system, re-pumpdown the vacuum chamber down to 30 microtorr and then apply the appropriate voltage profile to recreate a high voltage sputtering plasma.

SUMMARY OF THE INVENTION

It is therefore an object of the invention to provide a method and apparatus for clearing electrical shorts due to coating flakes in a sputtering chamber.

It is a further object of the invention to provide an effective means for vaporizing any flakes which short circuit a high voltage cathode in a sputtering chamber.

It is still a further object of the present invention to provide an efficient method for vaporizing any flakes of neutron absorber material which may short circuit a high voltage cathode during a sputtering operation.

It is still a further object of the invention to provide a sputtering chamber having a separate ac power source for vaporizing any flake materials shorting a sputtering cathode.

To achieve the foregoing and other objects and in accordance with the purpose of the present invention as embodied and broadly described herein, the sputtering chamber of the present invention may comprise an apparatus having at least one cathode assembly which is energized by a dc source and where the cathode assembly is provided with a shorting flake evaporation system.

The flake evaporation system comprises a switching configuration for selectively connecting the dc power source of the cathode assembly in order to create a sputtering plasma in the sputtering chamber during normal operation. An auxiliary power source is also provided which may be selectively connected to the cathode assembly whenever a shorting flake interferes with the operation of the sputtering chamber. Means are provided for controlling the various switches to selectively connect either the dc power source or the auxiliary power source to the cathode assembly depending upon whether normal operation or flake short evaporation is required.

Preferably, means are also provided for continuously monitoring the voltage across the cathode assembly and for monitoring the current from the dc power source in order to determine when a shorting flake is present. Upon a determination that a shorting flake is present, means are provided for automatically disconnecting the dc source from the cathode assembly and connecting the flake evaporating auxiliary power source.

In another aspect of the present invention, a method of evaporating shorting flakes in a sputtering chamber having a cathode assembly, a dc source for energizing the cathode assembly, and an auxiliary power source for evaporating any shorting flakes is provided. The method comprises the steps of monitoring the voltage across the cathode assembly while it is energized by the dc source. Simultaneously, the current delivered by the dc source to the cathode assembly is monitored. Based upon the monitored voltage and current, a determination is made, preferably by a specially programmed microprocessor or the like, whenever the cathode assembly is short circuited by a shorting flake. Upon such a determination, the dc source is disconnected from the cathode assembly and the flake evaporating auxiliary power source is connected for a predetermined period of time, after which the dc source is reconnected to the cathode assembly.

Preferably, if after reconnection of the dc source, it is determined from the voltage and current monitors that a shorting condition still exists, the entire cycle is repeated. If after a predetermined number of flake evaporation cycles, the shorting condition remains, the microprocessor control system will automatically shutdown the sputtering chamber and/or enunciate a warning or alarms that a fault condition exists.

BRIEF DESCRIPTION OF THE DRAWINGS

The accompanying drawings, which are incorporated in and form a part of the specification, illustrate a presently preferred embodiment of the invention and together with the description, serve to explain the principles of the invention. In the drawings.

DETAILED DESCRIPTION OF THE INVENTION

Figure 1:
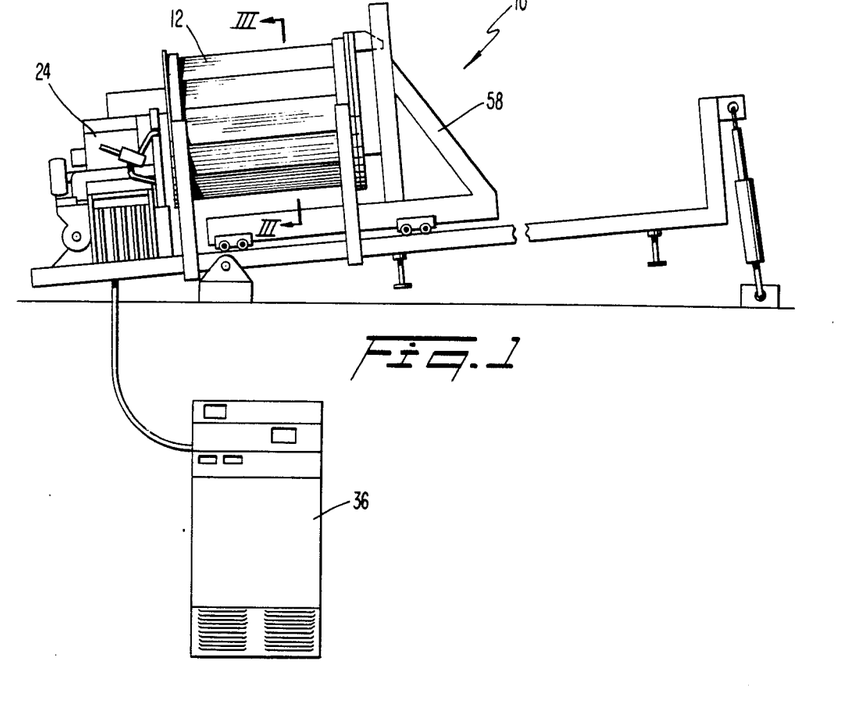
FIG. 1 is a schematic view of a coating apparatus with which the present invention may be used, wherein a drum of the apparatus is fully inserted into a sputtering chamber.
Figure 2:
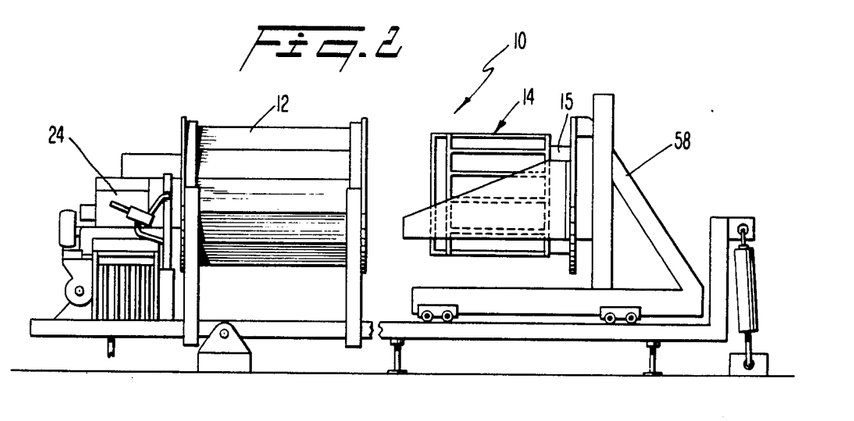
FIG. 2 is a schematic view of the coating apparatus of FIG. 1 wherein the drum is retracted from the sputtering chamber.
Figure 3:
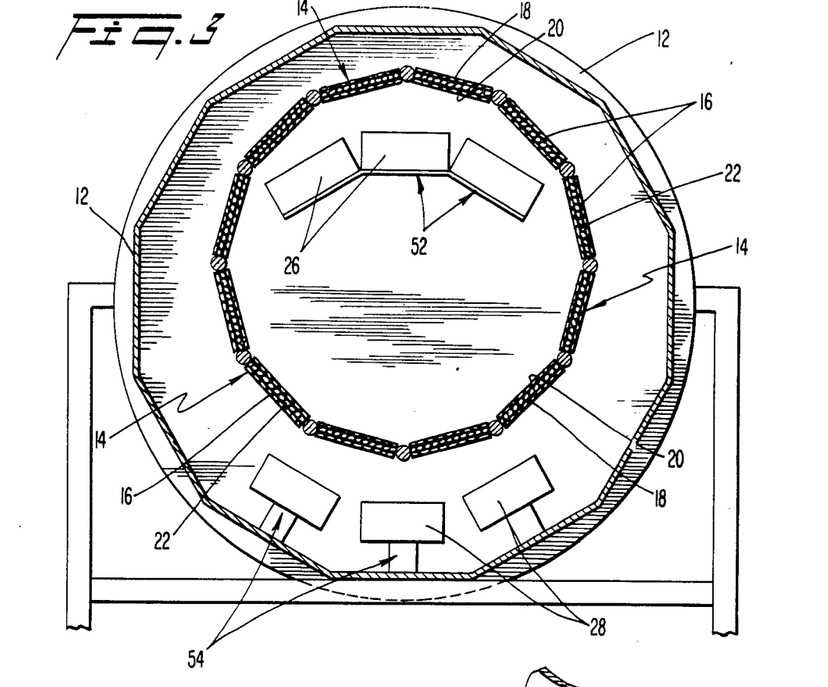
FIG. 3 is a schematic, sectional view along lines III—III of FIG. 1.

Reference will now be made in detail to a presently preferred embodiment of the invention, an example of which is illustrated in the accompanying drawings. Turning first to FIGS. 1 through 5, there is illustrated an exemplary nuclear fuel pellet coating deposition apparatus which may be used in conjunction with the present invention. Details of this apparatus are described in the above-referenced patent application, Ser. No. 623,747, the content of which is hereby incorporated by reference. The coating apparatus 10 includes a vacuum chamber 12 and a generally cylindrical, skeleton-like drum 14 which is slowly rotatable about its longitudinal axis by a motor 15. The drum 14 is hermetically sealable within the vacuum chamber 12. FIG. 1 illustrates the drum 14 installed within the vacuum chamber 12. FIG. 2 illustrates drum 14 removed from the vacuum chamber 12. The longitudinal axis of the drum may be oriented generally horizontally but is preferably tilted. As best seen in FIG. 3, a plurality of detachable, enclosed pallets 16 are positioned about the circumference of the drum 14. The coating apparatus 10 includes a sputtering machine 24 having at least one stationary upper target 26 and at least one stationary lower target 28. Preferably, the targets 26 and 28 each include a number of target tiles 30 (FIG. 4) which are ionized and sputtered as a coating onto the nuclear fuel pellets 22. A control console 36 is used to control the drum motor 15 and the sputtering machine 24.

Typically, the fuel pellets 22 are generally right circular cylindrical pellets of uranium dioxide and have a length of approximately 0.530 inch, a diameter of approximately 0.3225 inch, and a weight of 7.8 g. The object of the sputtering process is to cover the pellets 22 with a coating of a burnable absorber, such as a 4/10 mil thick layer of zirconium diboride ($ZrB_2$). Other pellet and coating dimensions may be chosen by the designer, as is known to those skilled in the art.

Typically, each of the pallets 16 may be of a generally rectangular configuraton capable of holding only a single layer of fuel pellets 22 and comprise lower and upper screened parts 18 and 20 schematically indicated in FIG. 3, having a suitable spacing therebetween for accommodating the fuel pellets. If such spacing allowed multiple fuel pellet layers in the pallet, problems could arise during sputtering, such as pellet chipping or breakage, dusty pellet coatings from pellet attrition, and lack of uniformity in pellet coatings.

The pallets 16 are preferably made of stainless steel to which sputtered zirconium diboride will not tightly adhere. The sputtering machine 24 sputters the coating onto the pellets 22. The technology for the anodes, the cathodes, and the support equipment for sputtering is known to those skilled in the art and is available commercially. The drum 14, including the pallets 16, and the chamber 12 comprise the anode for the sputtering machne 24.

The sputtering machine 24 may have one or more upper sputtering cathode assemblies 52 for supporting the stationary upper targets 26 such that, when the drum 14 is placed in the chamber 12, the upper targets 26 are disposed inside and proximate the drum's circumference at a location which is above the drum's longitudinal axis. The stationary upper targets 26 are oriented to face generally upward and radially outward. As best seen in FIGS. 5(a)–(d), the target tiles 30 are held in the sputtering cathode assemblies 52 by metal retainer strip 32 which encloses each array of tile targets. A downward target orientation would cause any fragmented target pieces to fall uselessly away or even to contaminate the surface of any substrate which may be located below. in the apparatus illustrated, the upper targets 26 sputter the coating onto those areas of the fuel pellets 22 which are exposed to the stationary upper targets 26 each time the pallets 16 rotate past.

The sputtering machine 24 may also have one or more lower sputtering cathode assemblies 54 for supporting the stationary lower targets 28 such that, when the drum 14 is placed in the chamber 12, the lower targets 28 are disposed outside and proximate the drum's circumference at a location which is below the drum's longitudinal axis. The lower targets 28 likewise are longitudinally positioned to correspond with the longitudinal position of the drum's open areas. The stationary lower targets 28 are oriented to face generally upward and radially inward. Concerning possible target fragmentation, the upward facing lower targets 28 behave like the upward facing upper targets 26 discussed in the previous paragraph. The lower targets 28 sputter a coating onto those areas of the fuel pellets 22 which are exposed to the stationary lower targets 28 each time the pallets 16 rotate by. The array of tiles 30 is enclosed by a metal strip 32, similar to that described above with reference to upper cathode assembly 52.

Although sputtering could be accomplished with a single upper and lower target pair of 26 and 28, it is preferred to have several, for example, three target pairs as illustrated herein, in order to achieve a higher coating rate.

In a typical sputtering apparatus, the zirconium diboride sputtering rate per cathode pair is 4/10 of a mill (final coating thickness) in 28 to 30 hours. Each target 26 or 28 typically comprises a $27 \times 5$ inch rectangle made up of 4 columns and 6 rows of zirconium diboride target tiles (each a rectangle of $4\frac{1}{2} \times 1\frac{1}{4}$ inch) $\frac{3}{8}$ inch thick.

Applicants have found that larger zirconium diboride target tiles 30 are thermally frangible, meaning they tend to break up during the sputtering process due to internal temperature differentials of several hundred degrees.

Each of the above-mentioned upper and lower cathode assemblies, which are disposed within the vacuum chamber 12, typically comprise a copper base 34 (see FIG. 5) which is liquid cooled, and upon which the target tiles 30 are placed. A permanent magnet (not illustrated) may be positioned beneath the targets to provide a directing force for the plasma which will result when a high dc voltage is applied between the cathode assemblies 52 and 54 and ground (anode) in the presence of a very thin Argon atmosphere. The pellets 22 are retained in the pallets 16 which are connected to ground. In the resulting high-temperature plasma, the burnable poison coating, in this case $ZrB_2$, migrates from the cathode assemblies onto the pellets, forming the desired coating.

Figure 4:
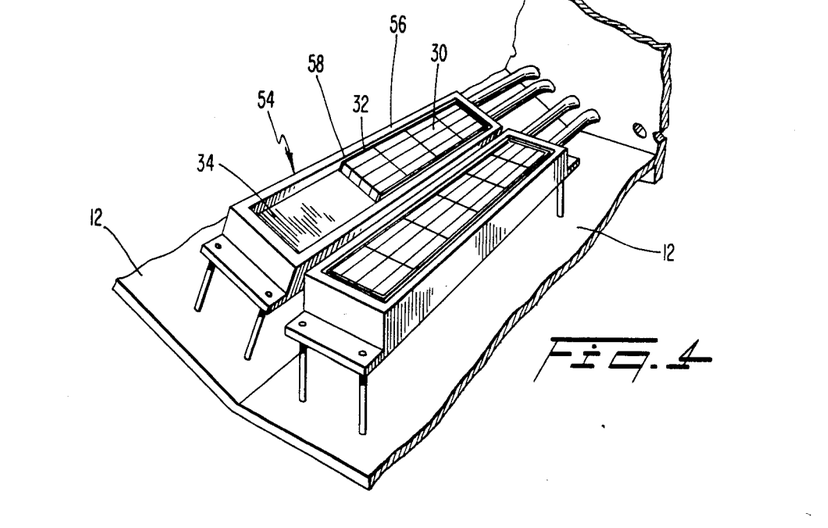
FIG. 4 is a front perspective view of a lower portion of the open chamber of FIG. 2 showing two stationary lower target assemblies in place.

As best seen in FIG. 4, the stationary lower targets 28 each are made up of a number of preferably identical target tiles 30 so that each target tile is interchangeable in position with the other target tiles. The stationary upper targets 26 are of a similar configuration.

In a typical stationary target, a metal shield 56 surrounds the $ZrB_2$ tiles. A small gap 58 is formed between the metal ground shield 56 and the metal retainer strip 32 which surrounds the $ZrB_2$ tiles. This gap can easily become shorted by a flake of $ZrB_2$. In the embodiment illustrated in FIG. 5(a), the gap 58 is positioned vertically about the inner perimeter of the metal ground shield 56 of the cathode assembly. With such a configuration, it is expected that flakes of $ZrB_2$ will frequently fall into and short circuit the gap.

Figure 5A:
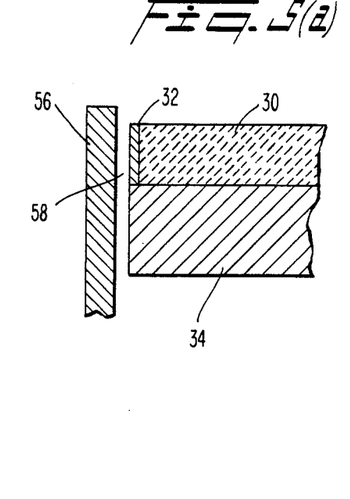
FIG. 5(a)-(d) are partial, sectional views along section V—V of FIG. 4, illustrating details of the gap between target and base in various embodiments of cathode assemblies.
Figure 5B:
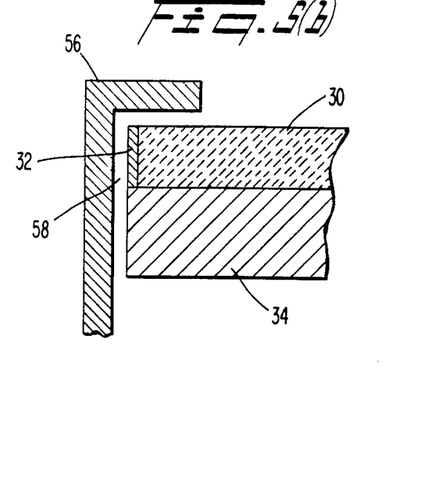

In the embodiment of FIG. 5(b), the gap 58 between the ground shield 56 and the retainer strip 32 (and target tiles 30) is somewhat protected from being shorted out by flakes of $ZrB_2$ since the gap 58 is covered by the overhanging ground shield 56 and thus is somewhat protected from flakes falling directly into it.

Figure 5C:
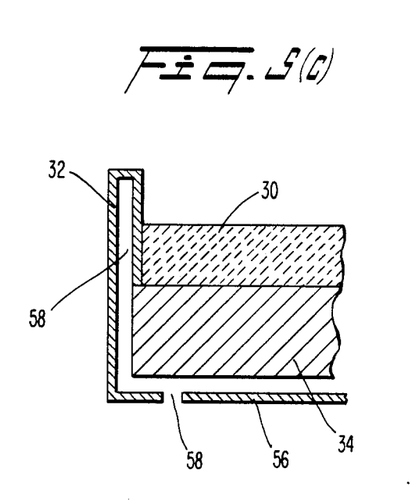

In the embodiment of FIG. 5(c), the retainer strip 32 bends around and under the base 34 so that the gap 58, between the retainer strip 32 and the ground shield 56, is disposed beneath and protected by the cathode assembly from most debris. In this embodiment, the gap 58 is much less likely to experience a shorting flake than, for example, the embodiment of FIG. 5(a).

Figure 5D:
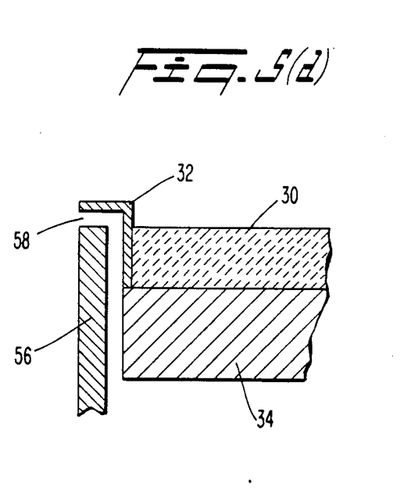

The embodiment of FIG. 5(d) is similar to that of FIG. 5(b) except that the gap 58 is formed laterally outside of and about the perimenter of the retainer strip 32 as opposed to laterally inside the perimeter as depicted in FIG. 5(b).

In other cathode assembly configurations, shorting flakes of $ZrB_2$ or other material will be more or less likely to fall into the gap between the retaining strip 32 and the ground shield 56, depending on the specific design thereof. In devices where many cathodes are used or where there is a large likelihood of a shorting flake disrupting operations, it is advantageous for the shorting flake evaporation system described below to be automated or microprocessor controlled. This is especially true in sputtering chamber designs where there is an unprotected gap between the target material (cathode) and the support structure (anode) which usually is earth ground and where flakes of target material may frequently fall into the gap and short out the cathode assembly. It should be understood that the copper cathode assemblies are typically energized at a potential of minus several hundred volts dc relative to earth-ground. However, it should be understood that the present invention is also useful in ungrounded or cathode grounded systems and does not depend on any particular current polarity.

In any event, regardless of the type of cathode assemblies used to support the targets 26 and 28, occasionally a flake of $ZrB_2$ may flake off and short circuit one or more of the sputtering cathode assemblies, thus interrupting the coating process. The present invention provides an efficient and effective means of evaporating or vaporizing such flakes without the time consuming need for breaking the vacuum in the vacuum chamber 12 to physically remove the flake.

In order to evaporate the shorting flake, a separate ac power source is used in conjunction with the conventional high voltage dc power source which energizes the sputtering cathode assemblies. The ac power source may be selectively energized (manually or automatically) to vaporize any $ZrB_2$ flakes which ground out, i.e., short circuit, a sputtering cathode assembly. By eliminating the need for physical access to a shorted out sputtering cathode assembly, the sputtering process down time is reduced from about six hours to about five minutes.

Figure 6:
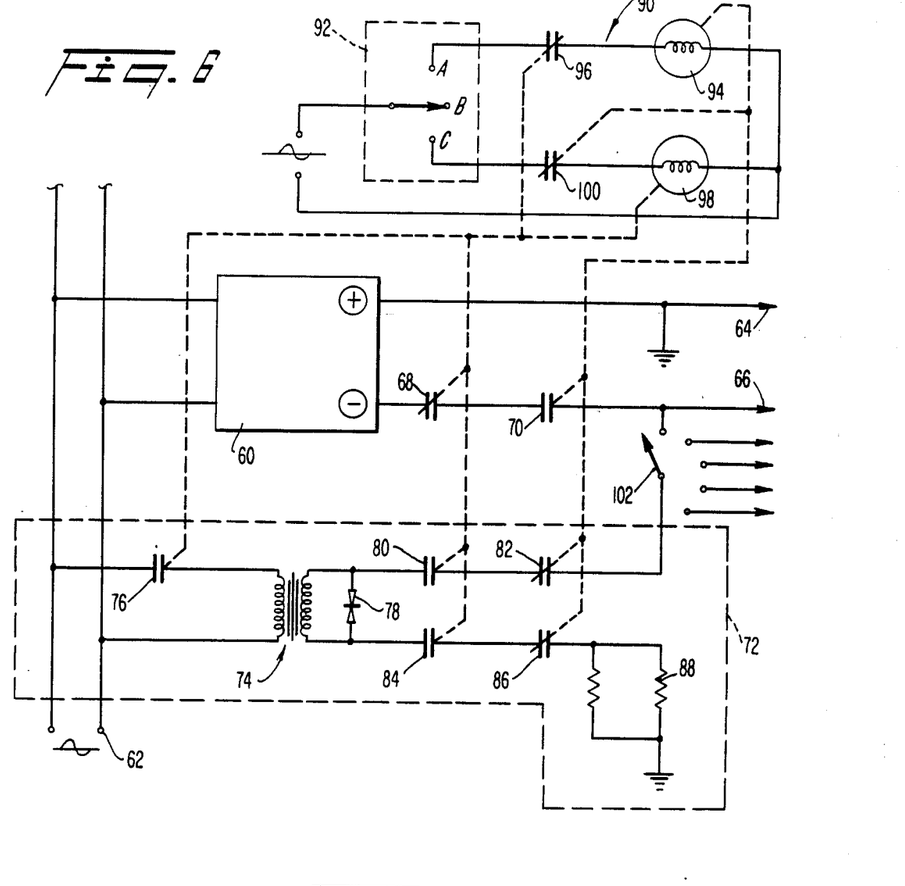
FIG. 6 is a schematic diagram of a power supply for energizing the cathode assemblies of FIGS. 3 and 4.

FIG. 6 illustrates a sputtering cathode power supply embodying the present invention.

A high voltage dc power supply 60 is energized through an ac mains 62. For a typical sputtering device, the dc power supply 60 will produce a negative 600 VDC output from a 440 VAC source. Of course, 120 V or 220 V ac utility supplied power sources can also be employed. Generally, at least minus 200 volts is required to ignite and maintain a sputtering plasma.

The positive output terminal 64 of the power supply 60 is connected to the ground shield 56 which is connected to the common anode of the sputtering apparatus 10. The negative output terminal 66 is connected to an upper or lower cathode assembly 52 or 54 of the apparatus 10 through relay operated switches 68 and 70. Preferably, each cathode assembly is individually energized (and, as further described herein below, monitored) so that interruption of power to one cathode will not affect the other cathode assemblies and so that ground faults can be easily identified and eliminated. Relay operated switch 68 is normally closed and relay operated switch 70 is normally open. The operation of these switches is described in detail below. As will be apparent to the artisan, electronic or mechanical switching can be substituted for these relay switches within the scope of the present invention.

According to the present invention, each of the cathode assemblies 52 and 54 is also connected to a high power, low voltage ac power source 72 through a switching arrangement. In the illustrated embodiment, the ac power source 72 comprises a step-down isolation transformer 74, connected to the main 62 through a relay switch 76. While it is convenient to energize both the dc power supply 60 and the ac power supply 72 from the same mains, it should be apparent to the artisan that different sources can be used to energize each.

Preferably, means such as a varistor 78 is connected across the secondary of the isolation transformer 74 to absorb and surpress transient voltages and voltage spikes. The transformer 72 preferably has a 60 VAC, (at 10 KVA) output winding, which will provide sufficient power at a low enough voltage to vaporize any flake which might tend to short a cathode to ground without creating uncontrolled ionizations. Since, as explained above, about 200 V is required to ignite or maintain a plasma, it is preferred that the ac power source be limited to a peak output of about 100 V to ensure pellet integrity. Preferably, a pair of relay operated switches 80 and 82 are connected between the transformer secondary and the cathode connection 66 and another pair of relay operated switches 84 and 86 are connected between the transformer secondary and ground. The use of two sets of series switches protects the transformer 74 from any high-voltage transients from the dc power supplies. In the illustrated embodiment, the switches 80 and 84 are normally open relay operated switches and the switches 82 and 86 are normally closed relay operated switches. The operation of these switches is described below.

Preferably, a ballast load comprising one or more tungsten lamps 88 is provided. For a typical installation, the ballast load should be able to dissipate about 2.0 to 6.0 KW. Whenever the ac power source is energized, this ballast load will be in series with whatever flake may be shorting out the cathode assembly. In normal use, the flake will vaporize before the tungsten filament heats up to limit the current passing through the circuit. If the ballast is in the form of a lamp, it will serve the additional function of providing a visual indication any time a cathode assembly is shorted by a more stubborn problem than a $ZrB_2$ flake, for instance, by a piece of loose metal or the like.

Preferably, the ac and dc power supplies, 60 and 72 respectively, to the cathode assemblies are controlled by a safety interlock system 90 which controls the abovementioned relay operated switches. The safety interlock system 90 is preferably powered from an ac main such as a 120 VAC utility line. Power is supplied to a threeposition switch 92 or equivalent device. In switch position "B", the power supply is off or deenergized. Switch position "A" is the "run" position in which dc power to the cathode is maintained. Switch position "C" is the "clear short" position, in which power to the ac power source is momentarily (e.g., 5–15 seconds) energized and the dc power source disconnected from the cathode. In that regard, the switch position "C" may comprise a push button or other type of timed switch which establishes contact for only a predetermined time interval when operated. In switch position "A", current is supplied to a relay 94 through a normally closed switch 96. In switch position "C", current is supplied to a relay 98 through a normally closed switch 100.

Relay 94, when energized, opens switches 100, 82 and 86 while closing switch 70. In this condition, power is supplied to the cathode contact 66 only by the dc power source 60. When power to relay 94 is removed, those switches return to their normal positions.

Relay 98, when energized, opens switches 96 and 68 while closing switches 76, 80 and 84. In this condition, power is supplied to the cathode contact 66 from the ac power source 72 and the dc power source 60 is disconnected from contact 66.

The isolation transformer 74 is selected to provide up to 150–200 continuous amperes at about 60 V AC. This is more than sufficient power to vaporize any conceivable $ZrB_2$ flake. For other applications, different requirements will present themselves. Since the applied ac voltage is low, e.g., 60 V, it will not ignite a plasma and will thus preserve the integrity of the pellet purity. In this regard, the peak ac voltage should be limited to a value which will not cause an arc between the cathode and ground when the flake is evaporated and raise a danger of uncontrolled sputtering.

Further, while the relay controlled switching described is preferred for many applications, other arrangements which would insure that the dc power source would not be connected to the cathode assembly during a short clearing process, and which would protect the sputtering equipment from electrical disturbances, are also be included within the scope of the present invention.

As will be apparent to the artisan, as soon as a flake is vaporized, the ac current to the cathode will be interrupted since the short which caused the shorting current is removed. At this point, it is safe to return to normal dc power operation and to restart the plasma generation operation in accordance with a predetermined voltage profile.

The illustrated embodiment is simplified for clarity and illustrates only one dc power supply 60. In practice, a plurality of high-voltage dc power supplies 60 may be used to energize the cathode assemblies 52 or 54. In the case of more than one dc power source and/or cathode assembly, a manually or electrically switched connection may be utilized so that a single high-current ac power source can be used to provide short-clearing service for all the cathode assemblies. Preferably a separate dc power source 60 is provided for each cathode assembly, although a sufficiently large dc source can be used to energize multiple cathode assemblies. The reason why separate power supplies are preferred is so that any failure, in either a cathode assembly or its power source, will not shut down the entire sputtering apparatus.

Figure 7:
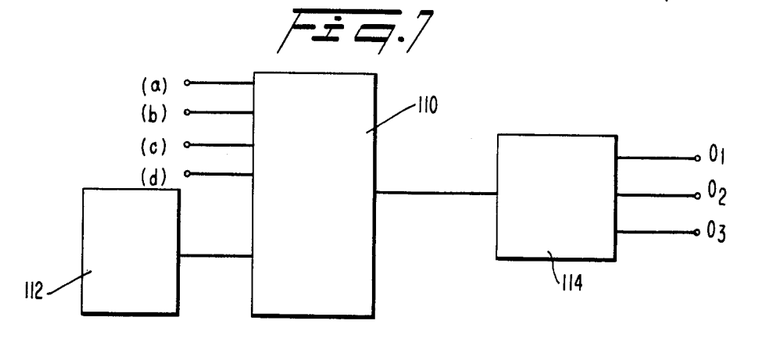
FIG. 7 is a simplified schematic of a process control system for controlling the power supply of FIG. 6.

In the power supply of FIG. 6 the operator of the sputtering apparatus would manually make and/or break all needed power connections by operation of the switch or switches 92. Such an arrangement is appropriate for a standby flake evaporation system which is not expected to be frequently used.

Where the cathode assembly configuration is such that frequent flake related shorts are expected or a large number of cathode assemblies are being controlled, an automatic system of the type illustrated in FIG. 7 is preferable.

In the system of FIG. 7 various system parameter information inputs a, b, c, d are connected to an input/output device 110 such as a Keithley or an Acromag Data Acquisition device. Input "a" may represent the instantaneous voltage between the cathode terminal 66 (FIG. 6) and ground. Input "b" may represent the instantaneous current flowing in the cathode circuit. Input "c" may represent a timing clock. No separate timing clock input is necessary if a process controller having a programmable internal clock is used. Input "d" represents the output of a conventional residual gas analyzer (RGA) capable of detecting small concentrations of various gases. Specifically, the RGA should be capable of sensing the presence of nitrogen which would indicate that the vacuum in the vacuum chamber 12 has been broken, or the presence of water vapor which would indicate a water leak, for example, from the cathode assembly cooling system (not illustrated).

A programmed supervisory computer 112, such as an IBMPC/XT is used as a system controller to provide instructions for controlling sputtering chamber conditions such as sputtering rates, sputtering times, applied voltages, etc. in a manner well known to artisans and which forms no part of the present invention. The status of the system is monitored by a process controller 114 such as a Westinghouse 700B NumaLogic Process Controller. The controller 114 preferably has three logical outputs $O_1$, $O_2$, $O_3$. Output $O_1$ is indicative of normal operation and, when present, will control the power supply to continue the sputtering process. Output $O_2$ is indicative of a positive output from the RGA input "d" and, when present, will immediately shut down the sputtering process and preferably activate an alarm or other indication to alert the operator to the presence of a leak. Output $O_3$ is indicative of a short circuit condition and, when present, will activate a short clearance sequence which is described in detail below.

The output $O_3$ is triggered, in accordance with predetermined short circuit criteria. For a typical sputtering process, a short circuit condition is defined as a voltage drop from cathode terminal 66 to ground of less than about 25 V and a cathode current of greater than 12-15 amperes where 17 amperes is the maximum current of the dc source 60. Since such conditions may exist momentarily for various reasons unrelated to a flake short (for example during start-up arcing), output $O_3$ is only triggered if those conditions persist for at least a predetermined time period, for example 1 second, which is preprogrammed into the process controller 114.

Upon the occurrence of a cathode assembly short, i.e., the presence of an output at $O_3$, the system controller 112 is preprogrammed to interrupt the flow of dc current to the shorted cathode assembly. After a delay of 1 to 5 seconds to prevent switch-over arcs, the power supply connections are switched, in a manner similar to that described above with regard to the safety interlock 90, to connect the ac source 72 to the shorted cathode assembly. The ac source 72 is then energized for a predetermined time period, for example, for about 5 to 15 seconds in order to vaporize the shorting flake, while information inputs a, b, c, d and supervisory computer instructions are monitored.

After the lapse of the predetermined time period, the ac power source 72 is deenergized. After a pause of about 1 to 5 seconds to prevent switch-over arcs, the connections between dc source 60 and the cathode terminal 66 are reestablished and the ac source 72 switched out of contact with the cathode terminal 66. The dc source 60 is then turned on in accordance with a predetermined voltage profile controlled by the system controller computer 112 and the cathode assembly conditions are monitored. if the conditions existing at the cathode assembly are acceptable, normal operation is continued. If the cathode assembly conditions are still not normal, indicating a short circuit still exists, the above-described sequence will be repeated but only for a limited number of attempts. If, after for example 3 to 5 attempts, the short circuit conditions remain, the system controller 114 will automatically shut down the sputtering apparatus and will preferably provide an indication that a repair is needed. Stubborn shorts which will not vaporize after a few attempts are likely to be the result of a solid, metallic object shorting out the cathode assembly.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, electronic switching schemes can be substituted for relays and a single general purpose computer can be used in lieu of the two computers 112 and 114 indicated in FIG. 7. Any power source which can be inserted into the cathode circuit to provide the necessary low voltage, high current for flake evaporation purposes can be used. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim as my invention:

1. In a sputtering chamber having at least one cathode assembly energized by a dc power source, a shorting flake evaporation device comprising:
   a first switching means for connecting said dc power source to said cathode assembly;
   an auxiliary power source;

a second switching means for connecting said auxiliary power source to said cathode assembly;

means for controlling said first and second switching means to selectively connect one of said dc power source and said auxiliary power source to said cathode assembly.

2. The apparatus according to claim 1 wherein said dc source has an output voltage of sufficient magnitude to create a sputtering plasma.

3. The apparatus according to claim 1 wherein said auxiliary power source comprises an ac source with an output voltage which is limited in magnitude to a voltage which is insufficient to create a sputtering plasma.

4. The apparatus according to claim 3 wherein said sputtering plasma is formed from a target material, and the ac source is operable to generate sufficient energy to vaporize shorting flakes of said target material.

5. The apparatus according to claim 1 wherein said sputtering chamber includes a plurality of cathode assemblies and further comprising a separate dc source for each of said cathode assemblies.

6. The apparatus according to claim 5 wherein said auxiliary power source comprises an ac source which is operable to be selectively connected to at least two of said plurality of cathode assemblies.

7. The apparatus according to claim 1 wherein said first switching means comprises a relay operated switch.

8. The apparatus according to claim 1 wherein said second switching means comprises a relay operated switch.

9. The apparatus according to claim 1 wherein said auxiliary power sources comprises an ac source which includes a step-down isolation transformer.

10. The apparatus according to claim 9 wherein said isolation transformer has a primary and a secondary winding and further comprising means for suppressing any transient voltages across at least one of said windings.

11. The apparatus according to claim 10 further comprising means for indicating the presence of a flake short.

12. The apparatus according to claim 10 further comprising a ballast means connected in series with said secondary winding for limiting current through said secondary winding when said ac source is energized.

13. The apparatus according to claim 1 wherein said auxiliary power source is operable to provide on the order of about 150 to 200 amperes at about on the order of 60 V.

14. The apparatus according to claim 1 wherein said first and second switching means each comprise at least one relay operated switch, and said controlling means comprises a means for selectively energizing and deenergizing said relay operated switches.

15. The apparatus according to claim 1 further comprising means for monitoring the voltage across said cathode assembly and means for monitoring the current from said dc source, and wherein said controlling means comprises means for automatically connecting either said dc source or said auxiliary power source to said cathode assembly according to said monitored voltage and current.

16. A method of evaporating shorting flakes in a sputtering chamber having a cathode assembly, a dc source for energizing said cathode assembly and an auxiliary power source for evaporating said shorting flakes, comprising the steps of:

a. monitoring a voltage across said cathode assembly while energized by said dc source;

b. simultaneously monitoring a current delivered by said dc source to said cathode assembly;

c. determining, based on said monitored voltage and current, when said cathode assembly is short circuited;

d. disconnecting said dc source from said cathode assembly when the said cathode assembly is determined to be short circuited;

e. connecting said auxiliary power source to said cathode assembly for a predetermined period of time to evaporate said short circuit;

f. reconnecting said dc source to said cathode assembly after said predetermined period of time.

17. The method of claim 16 further comprising the steps of:

a. continuing said monitoring steps to determine whether said cathode assembly is short circuited;

b. repeating said steps d. to f. if said cathode assembly is determined to be short circuited.

18. The method of claim 16 further comprising the steps of:

a. pausing for a first predetermined time interval between said steps d. and e., and b. pausing for a second predetermined time interval between said steps e. and f.

19. The method of claim 16 wherein said step of reconnecting further comprises the step of ramping up said dc source according to a predetermined voltage profile.

20. The method of claim 17 further comprising the steps of repeating said steps d. to f. for a predetermined number of sequences; and shutting down said sputtering chamber if said cathode assembly is determined to be short circuited after said predetermined number of sequences.

21. An apparatus for energizing a cathode assembly in a sputtering chamber comprising:

a dc power source, a first switching means for connecting said dc power source to said cathode assembly;

an ac power source;

a second switching means for connecting said ac power source to said cathode assembly;

means for controlling said first and second switching means to selectively disconnect one of said dc power source and connect said ac power source to said cathode assembly for clearing shorting flakes in said cathode assembly.

22. The apparatus according to claim 21 wherein said dc source has an output voltage of sufficient magnitude to create a sputtering plasma.

23. The apparatus according to claim 21 wherein said ac source has an output voltage which is limited in magnitude to a voltage which is insufficient to create a sputtering plasma.

24. The apparatus according to claim 23 wherein said sputtering chamber is operable to contain a sputtering plasma and wherein said sputtering plasma is formed from a target material, and said ac source is operable to generate sufficient energy to vaporize shorting flakes of said target material.

25. The apparatus according to claim 21 wherein said first switching means comprises a relay operated switch.

26. The apparatus according to claim 21 wherein said second switching means comprises a relay operated switch.

27. The apparatus according to claim 21 wherein said ac source includes a step-down isolation transformer and further comprising means for suppressing any transient voltages across at least one of said windings.

28. The apparatus according to claim 21 wherein said ac source is operable to provide on the order of about 150 to 200 amperes at about on the order of 60 V.

29. The apparatus according to claim 21 wherein said first and second switching means each comprise at least one relay operated switch and said controlling means comprises a means for selectively energizing and deenergizing said relay operated switches.

30. The apparatus according to claim 21 further comprising means for monitoring the voltage across said cathode assembly and means for monitoring the current from said dc source, and wherein said controlling means comprises means for automatically connecting either said dc source or said ac source to said cathode assembly according to said monitored voltage and current.

* * * * *